(12) United States Patent
Tamai

(10) Patent No.: US 9,399,268 B2
(45) Date of Patent: Jul. 26, 2016

(54) LASER WELDING METHOD, LASER WELDING JIG, AND SEMICONDUCTOR DEVICE

(71) Applicant: FUJI ELECTRIC CO., LTD., Kawasaki-shi, Kanagawa (JP)

(72) Inventor: Yuta Tamai, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 7 days.

(21) Appl. No.: 14/528,537

(22) Filed: Oct. 30, 2014

(65) Prior Publication Data

US 2015/0179539 A1    Jun. 25, 2015

(30) Foreign Application Priority Data

Dec. 19, 2013 (JP) ................... 2013-262226

(51) Int. Cl.
| | |
|---|---|
| *H01L 23/48* | (2006.01) |
| *B23K 26/22* | (2006.01) |
| *H01L 23/00* | (2006.01) |
| *B23K 26/32* | (2014.01) |
| *H01L 23/049* | (2006.01) |
| *H01L 21/48* | (2006.01) |
| *H01L 23/373* | (2006.01) |

(52) U.S. Cl.
CPC .............. *B23K 26/22* (2013.01); *B23K 26/037* (2015.10); *B23K 26/0622* (2015.10); *B23K 26/211* (2015.10); *B23K 26/32* (2013.01); *H01L 21/4846* (2013.01); *H01L 23/049* (2013.01); *H01L 24/32* (2013.01); *H01L 24/75* (2013.01); *H01L 24/83* (2013.01); *B23K 2201/34* (2013.01); *B23K 2201/42* (2013.01); *B23K 2203/08* (2013.01); *B23K 2203/10* (2013.01); *B23K 2203/12* (2013.01); *H01L 23/3735* (2013.01); *H01L 2224/32225* (2013.01); *H01L 2224/32245* (2013.01); *H01L 2224/7555* (2013.01); *H01L 2224/75261* (2013.01); *H01L 2224/83224* (2013.01); *H01L 2224/83801* (2013.01); *H01L 2224/83895* (2013.01);

(Continued)

(58) Field of Classification Search
CPC ... H01L 23/049; H01L 23/3735; H01L 24/83; H01L 24/32; H01L 24/75; H01L 2924/181; H01L 2924/00; H01L 2924/13055; H01L 2924/1042; H01L 2924/01046; H01L 2924/01079; B23K 26/22; B23K 26/211; B23K 26/32; B23K 26/0622; B23K 26/037
USPC ......... 257/734, 739, 747, 752, 753, 666, 668, 257/670, 672, 676
See application file for complete search history.

(56) References Cited

U.S. PATENT DOCUMENTS

2007/0075055 A1* 4/2007 Komatsu ............... B23K 26/04
219/121.63
2007/0199926 A1  8/2007 Watanabe et al.

(Continued)

FOREIGN PATENT DOCUMENTS

| JP | H07-014969 A | 1/1995 |
|---|---|---|
| JP | 2000-307058 A | 11/2000 |

(Continued)

*Primary Examiner* — Hoa B Trinh
(74) *Attorney, Agent, or Firm* — Manabu Kanesaka

(57) ABSTRACT

In a laser welding method, a gap between first and second members to be welded is made at most 300 μm by pressing the second member against the first member with claws that are pressing parts of a laser welding jig, and the second member to be welded at a place between the claws is irradiated by laser light to laser-weld the first member and the second member. In a semiconductor device, the gap between the first member and the second member at the portion of laser-welding is at most 300 μm.

6 Claims, 15 Drawing Sheets

(52) U.S. Cl.
CPC .......... *H01L2924/01028* (2013.01); *H01L 2924/01046* (2013.01); *H01L 2924/01079* (2013.01); *H01L 2924/12042* (2013.01); *H01L 2924/13055* (2013.01); *H01L 2924/181* (2013.01); *H01L 2924/40102* (2013.01)

(56) References Cited

U.S. PATENT DOCUMENTS

2008/0150102 A1 6/2008 Yokomae et al.
2010/0295187 A1 11/2010 Tsuruoka et al.

FOREIGN PATENT DOCUMENTS

| | | |
|---|---|---|
| JP | 2001-045634 A | 2/2001 |
| JP | 2004-096135 A | 3/2004 |
| JP | 2007-265962 A | 10/2007 |
| JP | 2008-098585 A | 4/2008 |
| JP | 2009-190067 A | 8/2009 |
| JP | 2011-077278 A | 4/2011 |
| JP | 2011-258888 A | 12/2011 |
| WO | 2009/081723 A1 | 7/2009 |

* cited by examiner

LASER WELDING METHOD, LASER WELDING JIG, AND SEMICONDUCTOR DEVICE

CROSS-REFERENCE TO RELATED APPLICATION

This application is based on, and claims priority to, Japanese Patent Application No. 2013-262226, filed on Dec. 19, 2013, contents of which are incorporated herein by reference.

BACKGROUND OF THE INVENTION

1. Field of the Invention

The present invention relates to a laser welding method, a laser welding jig, and a semiconductor device manufactured by applying the laser welding method.

2. Description of the Related Art

FIG. 15 shows a construction of an ordinary power semiconductor module 500. This power semiconductor module 500 comprises: heat radiating base 51, a direct copper bonding (DCB) substrate 54 having a rear surface conductor pattern 53 fixed to the heat radiating base 51 through a joining material 52 such as solder, a semiconductor chip 57 fixed onto a front surface conductor pattern 55 of the DCB substrate 54 through a joining material 56 such as solder, a terminal-inserted type resin casing 58 fixed to the heat radiating base 51, and terminals 59, 60, and 61 fixed to the terminal-inserted type casing 58.

The power semiconductor module 500 further comprises a surface electrode and a gate pad (which are not depicted) of the semiconductor chip 57, and bonding wires 62 for connection among the surface electrodes, the gate pad, the front surface conductor pattern 55, and terminals 59, 60, and 61. The power semiconductor module 500 contains sealing gel material 63 filling the terminal-inserted type resin casing 58.

The DCB substrate 54 is composed of a ceramic insulated substrate 54a, a rear surface conductor pattern 53, and a front surface conductor pattern 55.

In a power semiconductor module 500 today, high current carrying capacity and small size are required. Thus, the semiconductor chip 57 of the module is used at a high current density for carrying heavy current and for down-sizing. Consequently, one of the most important issues with the recent power semiconductor module 500 is effective radiation of heat generated in the semiconductor chip 57 in order to secure reliability in high power operation.

To solve this issue, a lead-frame, which has a larger cross-sectional area of the current path and greater heat capacity than those of conventional bonding wires 62, is used in a known power semiconductor nodule 57 in place of the bonding wires 62. The lead-frame is partly utilized for wiring terminals and externally leading-out terminals. The wiring terminal is joined to the surface of the upper main electrode of the semiconductor chip 57 and utilized for a heat removing path. Thus, the heat generated in the semiconductor chip 57 is removed also from the upper surface thereof, as well as from the lower surface.

Patent Document 1 discloses a means for improving heat removal and averaging the temperature distribution on the chip. The means is composed of a heat spreader with high thermal conductivity joined on the upper surface of the semiconductor chip to spread the heat in the central region of the semiconductor chip toward surroundings.

In the wiring construction as described above, the joining process between the externally leading out terminal and the wiring terminal using a lead frame is carried out by means of laser welding as disclosed in Patent Document 2 as well as resistance welding and ultrasonic bonding. The laser welding joins two materials to be welded by first melting the materials with the energy of laser light and then cooling down them to a solid state. The laser welding has a characteristic feature, unlike the resistance welding and ultrasonic bonding, that the welding process can be carried out without contacting the joining apparatus the materials to be welded. Known laser welding techniques include seam welding and spot welding. In the seam welding, the material to be welded melts by continuously irradiating laser light, and in the spot welding, the material to be welded melts by irradiating high power pulse laser light on a spot of the material. Because the spot welding uses laser light with a high energy density, deep weld penetration is achieved as compared with the seam welding. Thus, two sheets of relatively thick metallic plates can be welded putting one on the other.

Patent Document 3 discloses laser welding at a plurality of places on lead-frame terminal and positioning of the material to be welded by preliminarily forming protruding parts and recessed parts at the position of laser welding of two sheets of materials.

Patent Document 4 discloses laser welding in which the laser welding place of the lead frame terminal is exposed out of the sealing resin.

Patent Document 5 discloses laser welding in which the lead frame to be welded is pressed and the vicinity of laser welding spot is pressed by a heat removing probe with a configuration of a circular or rectangular column.

Patent Document 6 discloses plating on laser welding places and covering the semiconductor chip with sealing resin to prevent sputtered particles from scattering onto the semiconductor chip.

Patent Document 7 discloses use of plating material of nickel, palladium, and gold.

Patent Document 8 discloses locally reducing the thickness of a lead frame to decrease rigidity of the lead frame.

Patent Document 9 discloses laser welding conducted through a light transmitting window of a slit.

[Patent Document 1] Japanese Unexamined Patent Application Publication No. 2000-307058

[Patent Document 2] Japanese Unexamined Patent Application Publication No. 2004-096135

[Patent Document 3] Japanese Unexamined Patent Application Publication No. 2001-045634 (FIGS. 1 through 7, in particular)

[Patent Document 4] Japanese Unexamined Patent Application Publication No. 2007-265962 (FIG. 2 and FIG. 8, in particular)

[Patent Document 5] Japanese Unexamined Patent Application Publication No. 2009-190067 (Paragraph 0007, paragraph 0008, and paragraph 0017, in particular)

[Patent Document 6] International Patent Application Publication WO 2009-081723 (FIG. 1, FIG. 8, and Paragraph 0024, in particular)

[Patent Document 7] Japanese Unexamined Patent Application Publication No. 2011-077278 (Paragraph 0026, in particular)

[Patent Document 8] Japanese Unexamined Patent Application Publication No. 2008-098585 (Paragraph 0043, in particular)

[Patent Document 9] Japanese Unexamined Patent Application Publication No. H07-014969

Power semiconductor modules 500, which can control a heavy current, are used in a wide range of industrial fields including motor control of electric vehicles and controllers for motor driving. In application in those fields, further down-sizing and enhancement of reliability of the power semiconductor module 500 are required. Down-sizing of the semiconductor chip 57 is being promoted in order to cope with down-sizing of the semiconductor module. This needs high current density in the semiconductor chip 57. Thus, effective removal of the heat generated in the semiconductor chip 57 is a key issue for ensuring high reliability in high power operation.

When a wiring terminal is joined with the main electrode surface of a semiconductor chip 57 and the wiring terminal is laser welded with the externally leading out terminal for the purpose of improving heat dissipation, the joined condition of the laser welding part affects the long term reliability of heat dissipation property and current carrying characteristic at the joint part.

If the joining area of the laser welded part is small, not only the heat removal path is narrow, but the welded part would become a spot of abnormal heating on running a heavy electric current.

A semiconductor device like the power semiconductor module 500 may suffer from thermal deformation in the whole module or a part thereof due to operation in an environment of violent temperature change and caused by Joule heating due to heavy current through the device. This thermal deformation can cause stress concentration at the laser welded part.

The main factors that impair stability of the joint condition of the laser welded part are the positional shift between the externally leading out terminal and the wiring terminal, and the gap between these terminals. The positional shift and the gap occur depending on a variety of factors including dimensional tolerance of these members (the externally leading out terminal and the wiring terminal), tolerance in assembling process, ease of assembling work, and thermal deformation of the module. The positional shift between the overlapped terminals may cause penetration of laser light through the terminal or damage of the module. If the gap between the terminals is too large, the thermal energy by the laser light is not transferred to the lower terminal, causing failure of joining.

Therefore, it is important for obtaining a stable laser welding part to minimize the positional shift and a gap between the terminals in the construction for laser welding the externally leading out terminal and the wiring terminal.

The Patent Documents 1 through 9 all fail to mention about using a laser welding jig having a plurality of pressing parts and laser welding while pressing one of the overlapped members to be welded.

SUMMARY OF THE INVENTION

The present invention has been made to solve the problems described above and an object of the present invention is to provide a semiconductor device, a laser welding method, and a laser welding jig in which joining strength at a welding part is enhanced.

To attain the above object, a semiconductor device of the invention comprises: a ceramic insulated substrate; a front surface conductor pattern fixed on a front surface of the ceramic insulated substrate; a semiconductor chip electrically connected to the front surface conductor pattern; a first member electrically connected to the semiconductor chip; and a second member laser-welded to electrically connect to the first member at one or more places or portions; wherein a gap between the first member and the second member at each of the places of laser welding is at most 300 μm.

This structure of the invented semiconductor device enhances joining strength between the first member and the second member.

In the invented semiconductor device, preferably, a distance between an outer periphery of one of the places of laser welding and an outer periphery of another of the places of laser welding is at most 2 mm.

This structure has a high joining strength between the first member and the second member because the distance between the places of laser welding is small.

In the invented semiconductor device, preferably, a thickness of the first member is at least 0.5 mm and a thickness of the second member is at most 1 mm.

This structure allows the energy of laser light to be sufficiently transferred to the first member, achieving a high joining strength between the first member and the second member.

In the invented semiconductor device, preferably, the first member and the second member are planar at least at a location around the place of laser welding.

This structure easily makes the gap between the first member and the second member be not larger than 300 μm.

In the invented semiconductor device, preferably, each of the first and second member has an engaging part for positioning the first member and the second member, and the place of laser welding is located at a different position from the engaging part.

This structure allows the first member and the second member to be positioned at the engaging part. Thus, positional shift scarcely occurs in the welding process.

The invented semiconductor device, preferably, further comprises a sealing material for sealing the ceramic insulated substrate, the front surface conductor pattern, the semiconductor chip, and a part of the first member, wherein the places of laser welding are not sealed with the sealing material.

This structure seals the ceramic insulated substrate, the front surface conductor pattern, and the semiconductor chip with the resin. Thus, the sputtered particles in the laser welding process do not generate a harmful effect such as short-circuiting.

A laser welding method of the present invention uses a laser welding jig having a plurality of pressing parts and comprises: a step of placing a second member on a first member; a step of pressing the second member with the plurality of pressing parts toward the first member to make a gap between the first member and the second member be at most 300 μm; and a first welding step of laser welding the first member and the second member by irradiating a surface of the second member at a location between the pressing parts with laser light while conducting the step of pressing.

This structure of the laser welding method achieves high joining strength between the first member and the second member.

The invented laser welding method, preferably, further comprises a second welding step of laser welding the first member and the second member in a region with a gap between the first member and the second member of at most 300 μm after the first welding step.

This structure of the laser welding method achieves high joining strength in the second welding step. The second welding step can be performed eliminating a pressing step.

In the invented laser welding method, preferably, a distance between centers of the places of laser welding is at most 4 mm.

The laser welding method achieves high joining strength because a distance between the laser welding places is short.

In the invented laser welding method, preferably, the method includes laser welding the first member and the second member having engaging parts for positioning the first member and the second member, and the place of laser welding is different from the engaging parts.

The laser welding method avoids direct deformation of the engaging part by laser welding, thus, positional shift between the first member and the second member scarcely occurs.

In the invented laser welding method, preferably, the laser welding method conducts laser welding for such a semiconductor device that comprises a ceramic insulated substrate, a front surface conductor pattern fixed on a front surface of the ceramic insulated substrate, a semiconductor chip electrically connected to the front surface conductor pattern, a first member electrically connected to the semiconductor chip, and a second member electrically connected to the first member that is laser welded to the second member at one or more places, the method comprising a step of sealing the ceramic insulated substrate, the front surface conductor pattern, the semiconductor chip, and a part of the first member with a sealing material before the step of putting the second member on the first member.

The laser welding method seals the ceramic insulated substrate, the front surface conductor pattern, the semiconductor chip with the resin. Thus, the sputtered particle in the laser welding process does not generate a harmful effect such as short-circuiting.

A laser welding jig of the present invention comprises a plurality of pressing parts, a distance between the pressing parts being a length of a width of laser welded region plus distance in two sides of the welded region, each distance being in the range of 0.5 mm to 3 mm.

This construction of the laser welding jig allows pressing a vicinity of the welding place preventing the pressing parts from contacting the region melted by the laser light in the laser welding process. Thus, positional shift between the first member and the second member scarcely occurs.

The present invention provides a laser welding method, a laser welding jig, and a semiconductor device manufactured using the laser welding method, in which the joining strength of the welded parts is enhanced.

BRIEF DESCRIPTION OF DRAWINGS

FIGS. 10A, 10B, and 100 are enlarged views of the part where the upper emitter terminal is put overlapped on the lower emitter terminal, each terminal having an engaging part.

DETAILED DESCRIPTION OF THE INVENTION

Some preferred embodiments of the present invention will be described in detail in the following with reference to the accompanying drawings.

First Embodiment

FIGS. 1A and 1B through FIGS. 4A and 4B show a laser welding method according to the first embodiment of the present invention in the sequence of the laser welding method. FIGS. 1A, 2A, 3A, and 4A are plan views and FIGS. 1B, 2B, 3B, and 4B are sectional views cut along the line Y-Y in FIGS. 1A, 2A, 3A, and 4A, respectively.

Figure 1A:
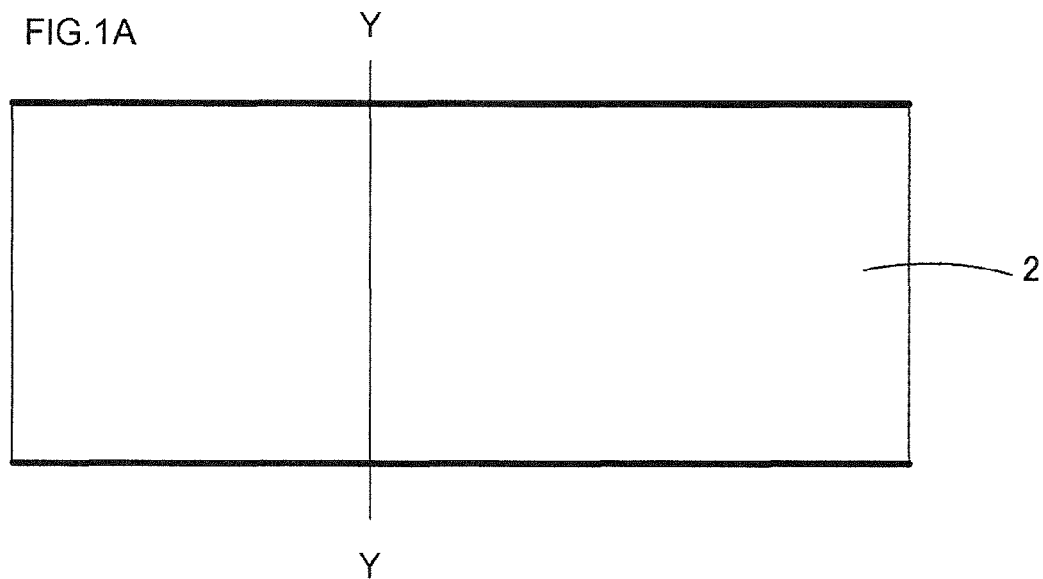
FIGS. 1A and 1B show a step in a laser welding method of the first embodiment of the present invention.
Figure 1B:
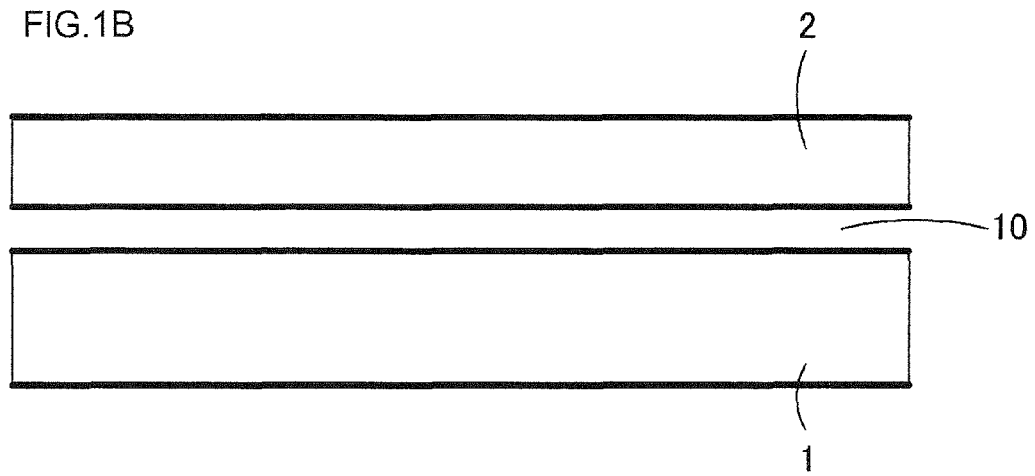

Referring to FIGS. 1A and 1B, a second member at the upper position, which is a second member 2 to be welded, is placed on a first member at the lower position, which is a first member 1 to be welded, with the first and second members overlapping each other. A gap 10 between the two members 1 and 2 to be welded can be larger than 300 µm in some cases. The first and second members 1 and 2 to be welded are composed of a high thermal conductivity material exhibiting a thermal conductivity of at least 100 W/(m·K). The material can be selected from copper (Cu), a copper-molybdenum (Cu—Mo) alloy, a copper-tungsten (Cu—W) alloy, molybdenum (Mo), tungsten (W), an aluminum-silicon carbide (Al—SiC) alloy, and a silicon-silicon carbide (Si—SiC) alloy, for example. The surface of the second member 2 to be welded on which laser light is irradiated is preferably plated with electroless nickel-phosphorus (Ni—P) plating, electroless nickel-boron (Ni—B) plating, or electrolytic nickel (Ni) plating, for example. The plating is favorable because it exhibits improved absorption coefficient of laser light.

Figure 2A:
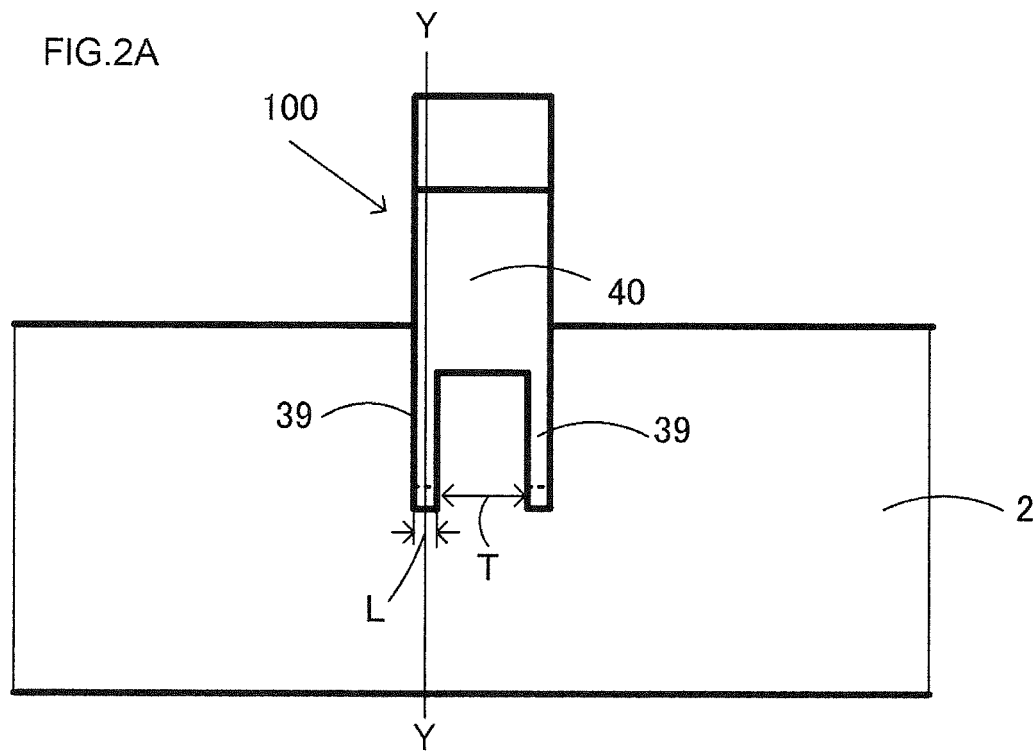
FIGS. 2A and 2B show a step in a laser welding method following the steps of FIGS. 1A and 1B.
Figure 2B:
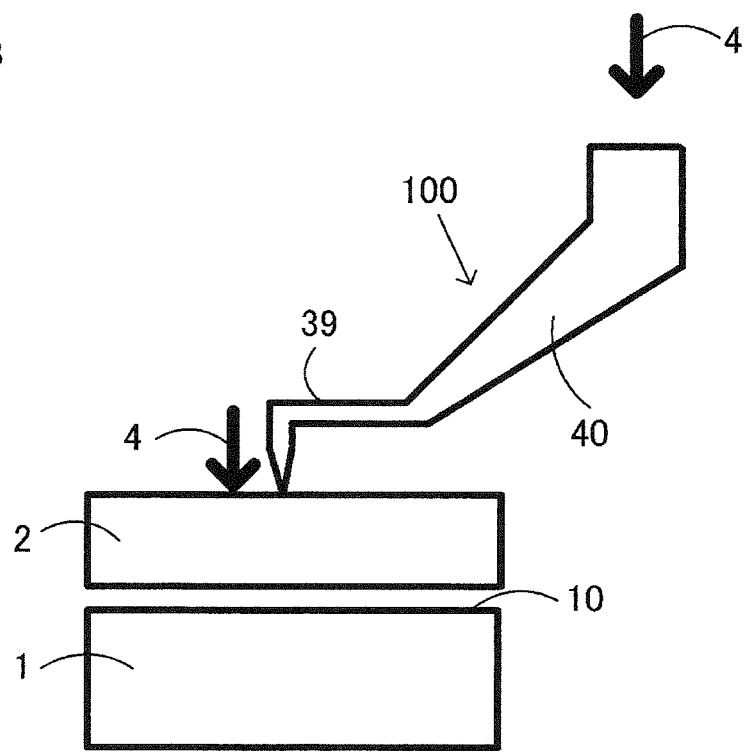

Then as shown in FIGS. 2A and 2B, a support column 40 of a laser welding jig 100 is pressed by a pressing device such as a pneumatically driven cylinder (not shown in the figure), for example. The laser welding jig 100 is moved to such a position that a welding part 5 (indicated in FIGS. 3A and 3B) falls between two claws 39, which are pressing parts, formed at the tip of the support column 40. The laser welding jig presses the second member 2 to be welded with a force 4 of about 3×9.8 N to make the gap 10 between the two members 1 and 2 to be welded be at most 300 µm. The pair of claws 39 is provided for making the gap 10 between the first and second members to be welded be sufficiently small in the overlapped state. The places of the claws that contact the second member 2 to be welded is a straight line with a length L of about 1 mm. In FIGS. 2A and 2B, the two contact places are aligned on a common straight line, but they can be arranged in parallel facing each other.

Figure 3A:
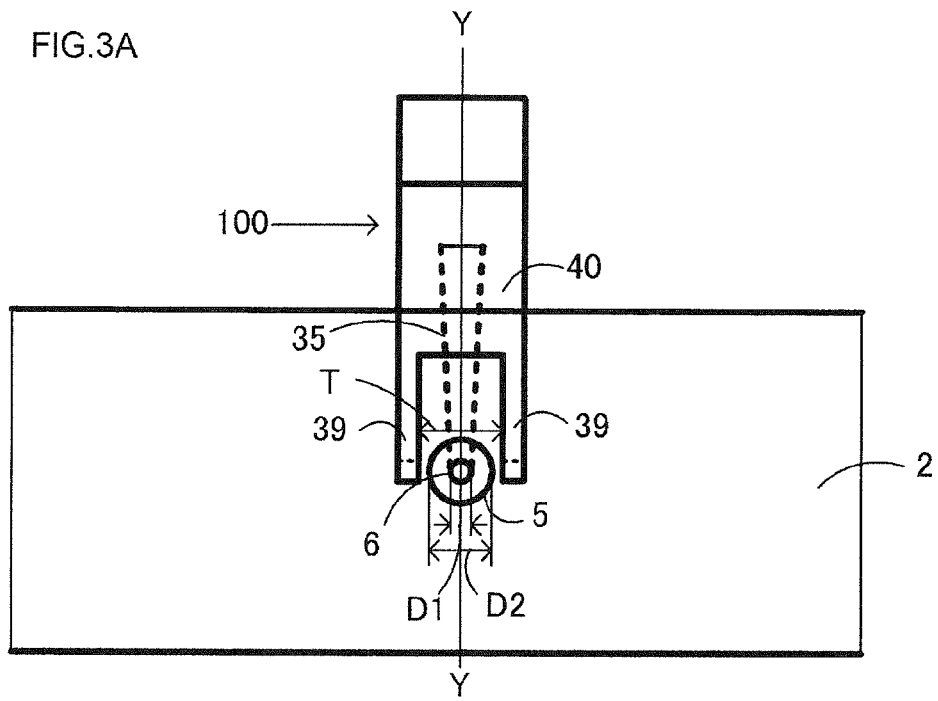
FIGS. 3A and 3B show a step in a laser welding method following the steps of FIGS. 2A and 2B.
Figure 3B:
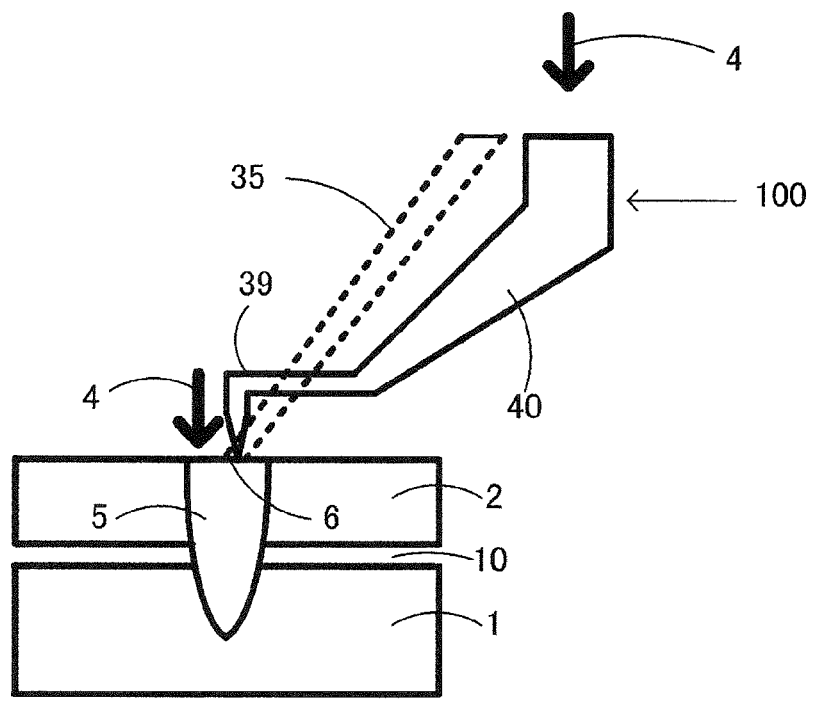

Then as shown in FIGS. 3A and 3B, an irradiation surface 6 is irradiated with laser light 35 to execute laser welding. The laser light 35 has a pulse waveform. The pair of claws 39 keeps its configuration until the welded place solidifies. The welded place cools down and solidifies rapidly through heat diffusion toward the welded members 1 and 2 in the surroundings.

Figure 4A:
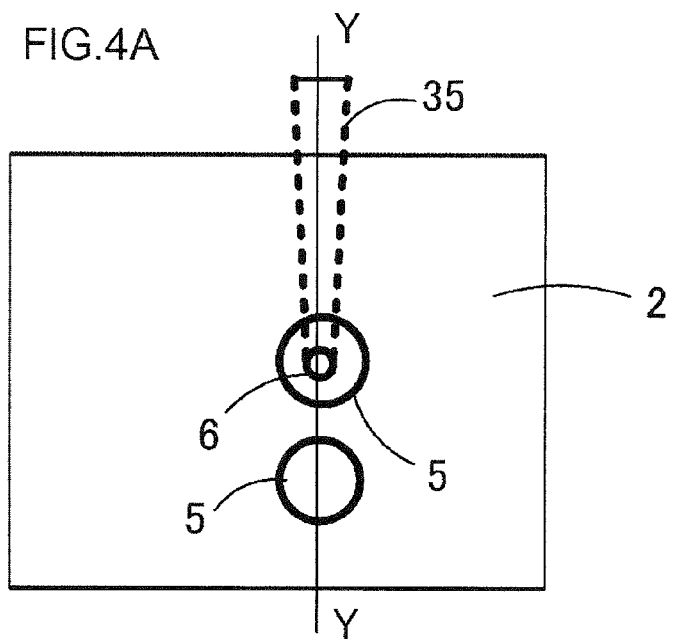
FIGS. 4A and 4B show a step in a laser welding method following the steps of FIGS. 3A and 3B.
Figure 4B:
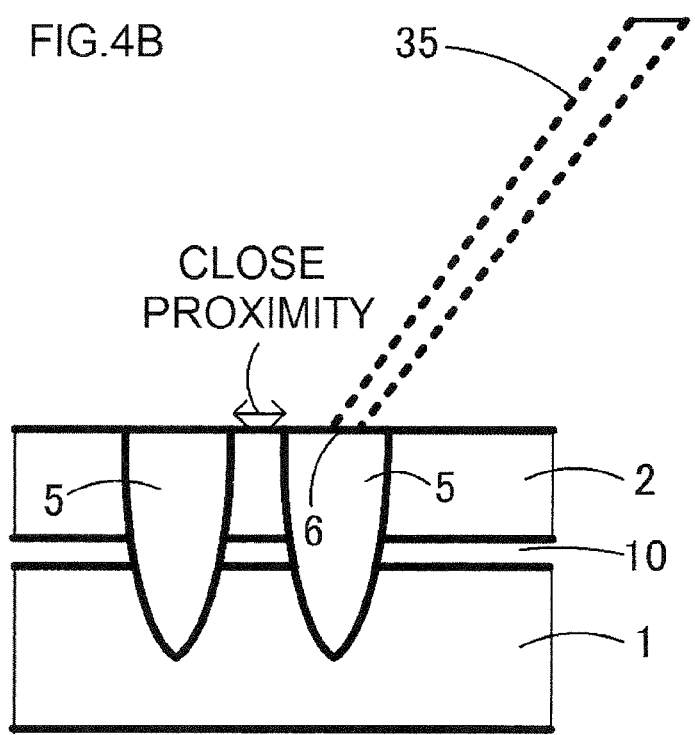

If there are two or more welding places, as shown in FIGS. 4A and 4B, after a first laser welding has finished, the pair of claws 39 is moved to a different place from the welded part 5 of first laser welding, and laser welding is conducted at a place next to the first welded part 5. Laser welding of second and thereafter are carried out without pressing the second member 2 to be welded with the pair of claws 39. Because the gap between the two members 1 and 2 has fixed to be not larger than 300 μm during the first laser welding, the laser welding of second and thereafter does not need to press the second member 2 to be welded with the pair of claws 39. Places of laser welding of second and thereafter can be any place as long as the gap between the two members 1 and 2 to be welded is ensured at a distance not larger than 300 μm.

According to the welding procedure, the step of pressing by the pair of claws 39 can be eliminated in laser welding of second and thereafter. Thus, a dead time can be shortened. When the places of laser welding of second and thereafter are set at a vicinity of within 2 mm from the first laser welding place, the distance between welded places 5 is sufficiently small, enhancing joint strength.

Laser welding can of course be conducted by pressing with the pair of claws 39 after moving the pair of claws 39 and the laser light 35 together.

Figure 7:
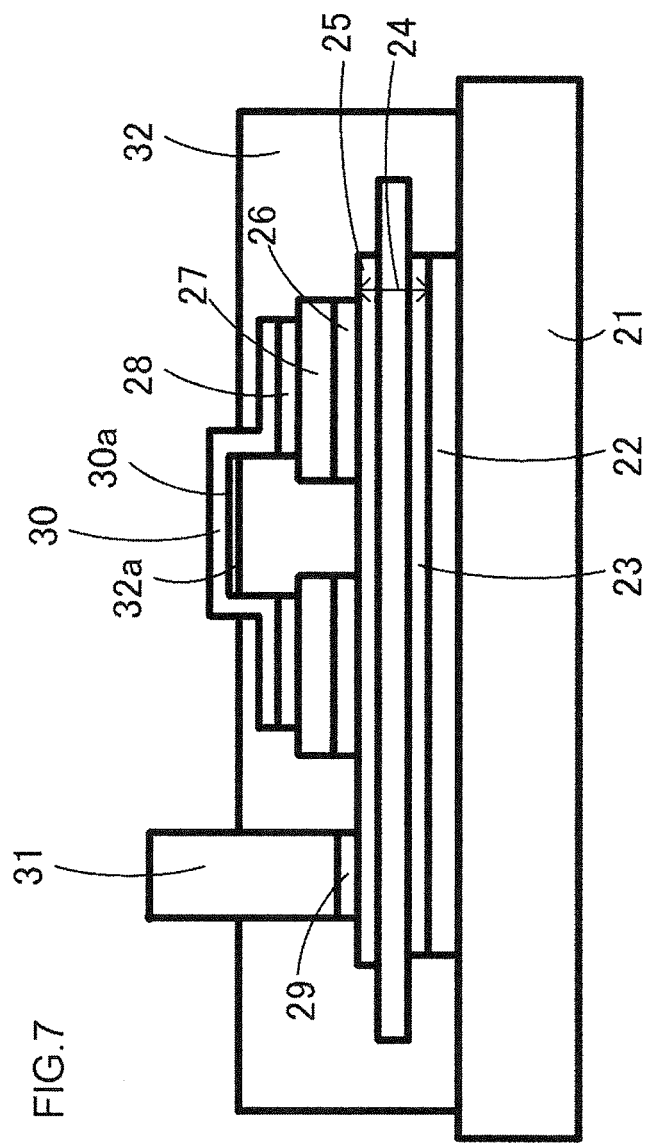
FIG. 7 is a sectional view showing an assembling step following the step of FIG. 6 of the semiconductor device.
Figure 8:
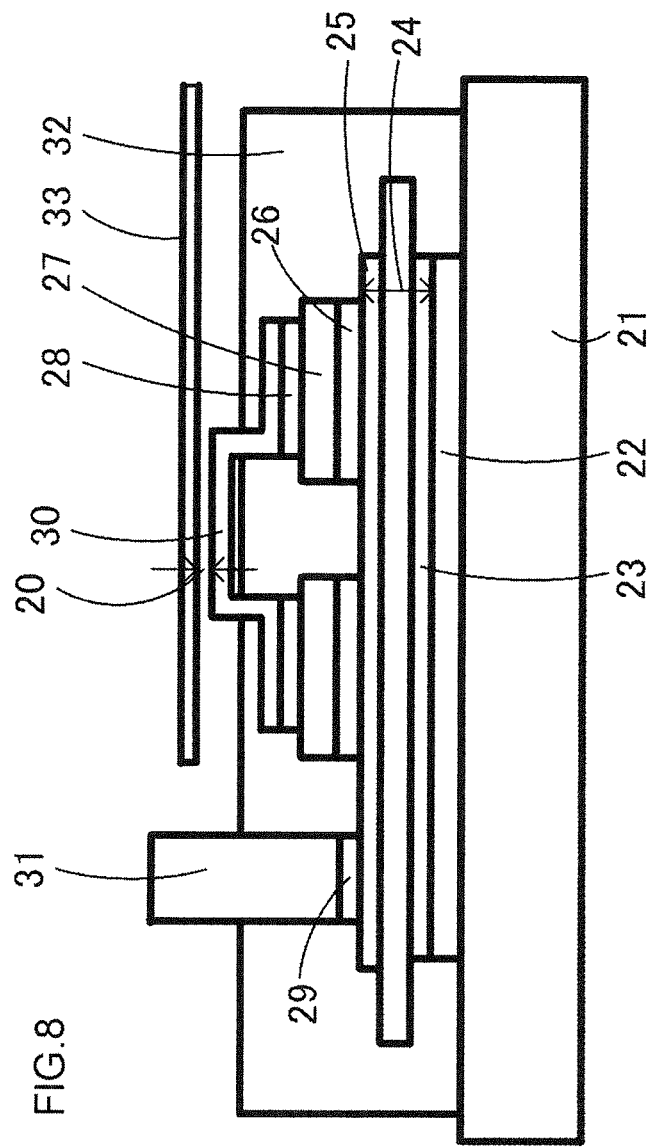
FIG. 8 is a sectional view showing an assembling step following the step of FIG. 7 of the semiconductor device.

Laser welding can be favorably carried out when the thickness of the first member 1 to be welded, which corresponds to the lower emitter terminal 30 in FIG. 7, is at least 0.5 mm, and the thickness of the second member 2 to be welded, which corresponds to the upper emitter terminal 33 in FIG. 8, is at most 1 mm. If the thickness of the first member 1 to be welded is less than 0.5 mm, the welded place of the first welded member may be punched through to the back surface. If the thickness of the second member 2 to be welded is larger than 1 mm, the welded part does not sufficiently penetrate into the first welded member, lowering the welding strength. If the output power of the laser light is enhanced too high in the intention of increasing of the welding strength, larger heat is conducted to the claws 39, resulting in deformation of the claws.

The distance between centers of laser welded parts is desirably not larger than 4 mm. If the distance is larger than 4 mm, the joining strength between the first member and the second member tends to decrease.

Second Embodiment

Figure 5A:
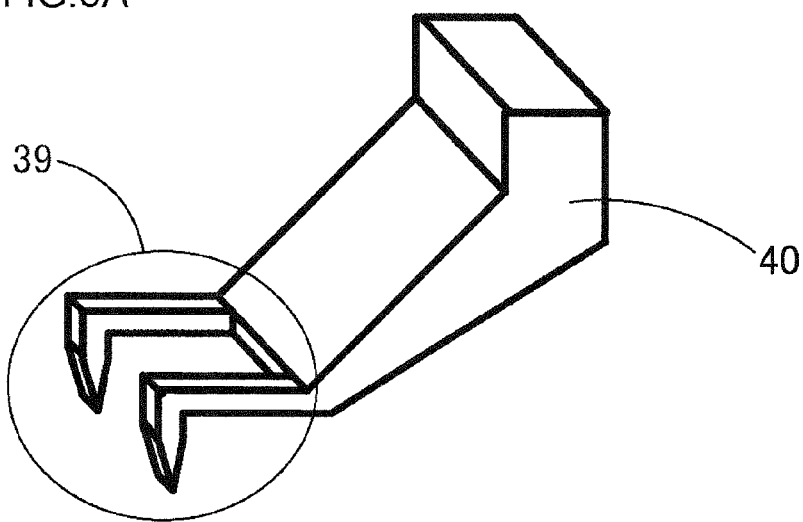
FIGS. 5A, 5B, and 5C show a construction of an essential part of a laser welding jig of the second embodiment of the present invention.
Figure 5B:
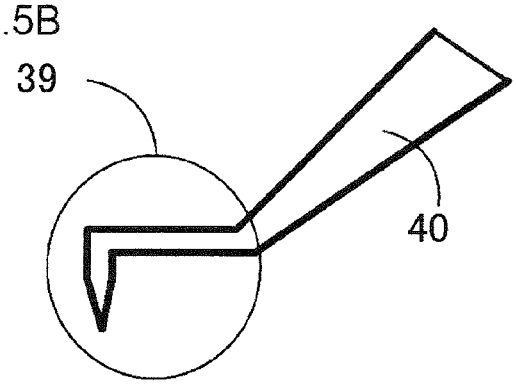
Figure 5C:
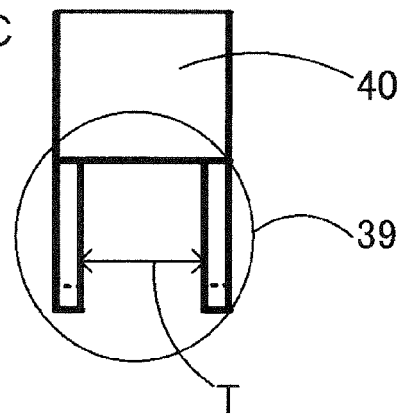

FIGS. 5A, 5B, and 5C show a construction of an essential part of a laser welding jig 100 according to the second embodiment of the present invention, in which FIG. 5A is a perspective view of the whole structure, FIG. 5B is a side view of a pair of claws 39, and FIG. 5C is a front view of the pair of claws 39.

The laser welding jig comprises a support column 40 and two claws 39 facing each other and connected to the support column 40. The pair of claws 39 pushes the both ends of an area of a welding part. The edges of the pair of claws are linear like a knife edge, but blunt. The pair of claws 39 depicted in FIGS. 5A, 5B, and 5C has linear edges in the direction 90 degrees-revolved in the horizontal direction with respect to the direction of extension of the claws 39. But the claws can be arranged in the direction rotated by 90 degrees from the direction depicted in FIGS. 5A, 5B, and 5C.

As shown in FIG. 3A, the distance T between the two claws 39 is wide enough not to interfere with laser light 35 and wider than the size of the welded part 5 that is a mark of fusion solidified after melted by the laser light 35. More specifically, when the irradiation area 6 by the laser light 35 is 0.4 mm in diameter D1, the diameter D2 of the welded part 5 is about 1.5 mm. Separating each of the claws 39 from the welded part 5 by a distance in the range from 0.5 mm to 3 mm, the interval T between the two claws 39 becomes 2.5 mm to 7.5 mm. The dimensions in these ranges are favorable because the pair of claws 39 does not interfere with the laser light 35, which means the laser light 35 does not irradiate the claws, and the welded part 5 does not contact the claws 39. The laser light 35 irradiates the place between the two claws 39. The locations pressed by the claws 39 are in the vicinity of the irradiation area 6 of the laser light 35, and the two claws 39 press the vicinity of the region to become the welded part 5 of the second member 2 to be welded to make the gap between the member 1 to be welded and the member 2 to be welded be at most 300 μm. In this arrangement, the laser light 35 irradiates the area between the two claws 39 to laser-weld the welding members 1 and 2.

If the interval T between the two claws 39 is too wide, the first member 1 to be welded and the second member 2 to be welded are insufficiently close contacting each other and the gap 10 between the two members is wider than 300 μm, lowering the joining strength of the welded part 5. Use of the laser welding jig 100 allows to press the vicinity of the welding part 5 and to narrow the gap 10 between the members 1 and 2 to be welded within 300 μm achieving a stable joint condition.

Third Embodiment

FIGS. 6 through 9 show a procedure of assembling a semiconductor device 200 that is the third embodiment of the present invention, and are sectional views showing assembling steps given in the sequence of the steps. These figures show assembling steps of a semiconductor device in which a wiring terminal on a semiconductor chip is joined with an externally leading out terminal by means of laser welding. In the assembling steps, the laser welding method described previously is applied.

Figure 6:
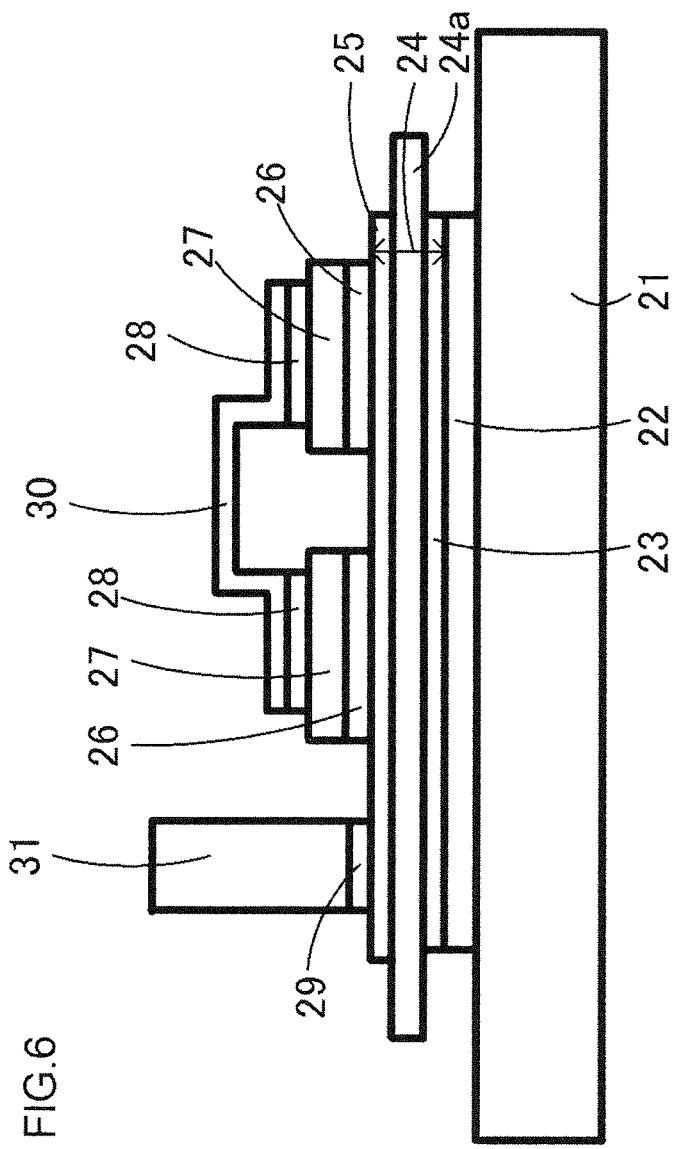
FIG. 6 is a sectional view showing an assembling step of a semiconductor device that is the third embodiment of the present invention.

Referring to FIG. 6, a semiconductor device 200 comprises a DCB substrate 24 having a rear surface conductor pattern 23 disposed on a heat radiating base 21 made of a high thermal conductivity material, for example copper or aluminum, intercalating a joining material 22 such as solder between them. In the procedure of assembling the semiconductor device 200, a semiconductor chip 27 and a collector terminal 31 are arranged on a front surface conductor pattern 25 formed on the surface of the DCB substrate 24 through joining materials 26 and 29, respectively, such as solder. Then, a lower emitter terminal 30 is arranged on a main electrode surface (not depicted) of the semiconductor chip 27 through a joining material 28. This lower emitter terminal 30 is a wiring terminal having a thickness of about 1.5 mm, for example. After heated to melt, the joining materials 22, 26, 28, and 29 are cooled and solidified to provide a monolithic body including the above mentioned components. The semiconductor chips 27 can be an insulated gate bipolar transistor (IGBT) and a free-wheeling diode (FWD) chip. The semiconductor chips 27 are electrically connected to the lower emitter terminal 30 through the joining material 28. The lower emitter terminal 30 is a wiring terminal, which is a first member or a first member to be welded, and made of a material, for example copper, exhibiting high electric conductivity and high thermal conductivity. The DCB substrate 24 is composed of a ceramic insulated substrate 24a, which is an insulated substrate made of ceramic, and a rear surface conductor pattern 23 and a front surface conductor pattern 25.

Then, as shown in FIG. 7, the components assembled to a state of FIG. 6 are sealed with a resin sealing material 32. The resin sealing material 32 can be an epoxy resin. The components are surrounded by a wall arranged at the periphery of the heat radiating base 21 and sealed with liquid state epoxy resin. The resin is cured to seal the components. Here, the upper surface of the lower emitter terminal 30 and the upper part of the collector terminal 31 are not sealed and are remaining exposed to the air. The semiconductor chips 27 and the joining material 28 are sealed with the resin.

The resin sealing material 32 seals the upper surface of the heat radiating base 21, the DCB substrate, the semiconductor chip 27, and the front surface conductor pattern 25. The surface 32a of the resin sealing material 32 is disposed not to contact the rear surface 30a of the lower emitter terminal 30. If the surface 32a of the resin sealing material 32 is contacting the rear surface 30a of the lower emitter terminal 30, the heat dissipation from the rear surface 30a of the lower emitter terminal 30 in the laser welding process is restricted, which expands the melted region and the melted region may unfavorably penetrate through the lower emitter terminal 30.

The step of resin sealing can be omitted in the case of rare sputtering particles in the laser welding process.

Then as shown in FIG. 8, an upper emitter terminal 33 is put overlapping on the lower emitter terminal 30 indicated in FIG. 7. The upper emitter terminal 33 is an externally leading out terminal, which is a second member or a second member to be welded. The thickness of the upper emitter terminal 33 is 1.0 mm, for example. At this stage, the gap 10 between the upper and lower emitter terminals 30 and 33 may be larger than 300 µm. The upper emitter terminal 33 is made of a material, for example copper, exhibiting high electrical conductivity and high thermal conductivity. The surface of the upper emitter terminal 33 is plated with electrolytic nickel, for example.

Figure 9:
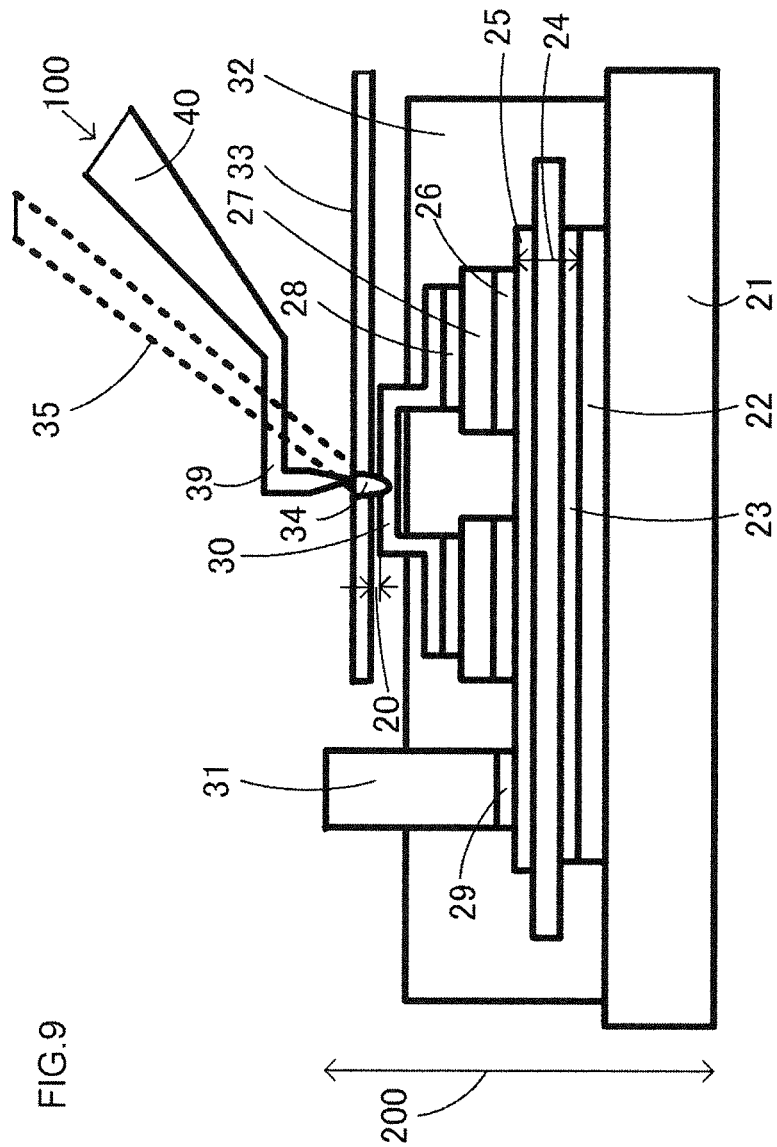
FIG. 9 is a sectional view showing an assembling step following the step of FIG. 8 of the semiconductor device.

Then as shown in FIG. 9, the surface of the upper emitter terminal 33 is pressed with a pair of claws 39 of a laser welding jig 100 to make the gap 10 between the upper and lower emitter terminals 30 and 33 be at most 300 µm. Subsequently, laser light irradiates the surface of the upper emitter terminal 33 between the two claws 39 to conduct laser welding of the upper emitter terminal 33 and the lower emitter terminal 30. When second laser welding is conducted at a nearby place, the gap 10 between the upper emitter terminal 33 and the lower emitter terminal 30 has already been made at a dimension not larger than 300 µm. Thus, the surface of the upper emitter terminal 33 is not necessarily pressed with the pair of claws 39, although the laser welding can be conducted while pressing the upper emitter terminal 33 with the pair of claws 39.

The distance between the outer peripheries of laser welded places is preferably at most 2 mm. If the distance is larger than 2 mm, the gap between the first member and the second member is liable to increase, which decreases the joining strength of the first and second members.

Figure 10A:
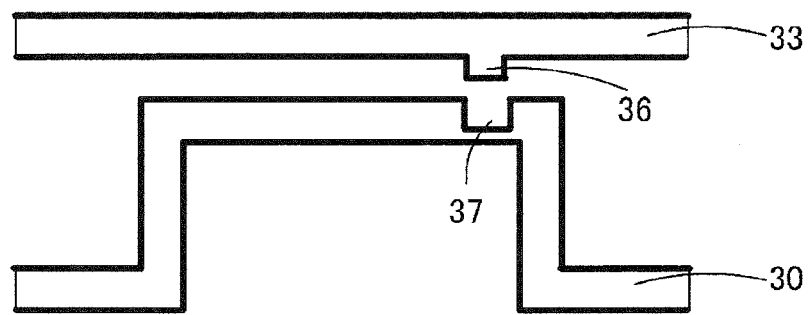
Figure 10B:
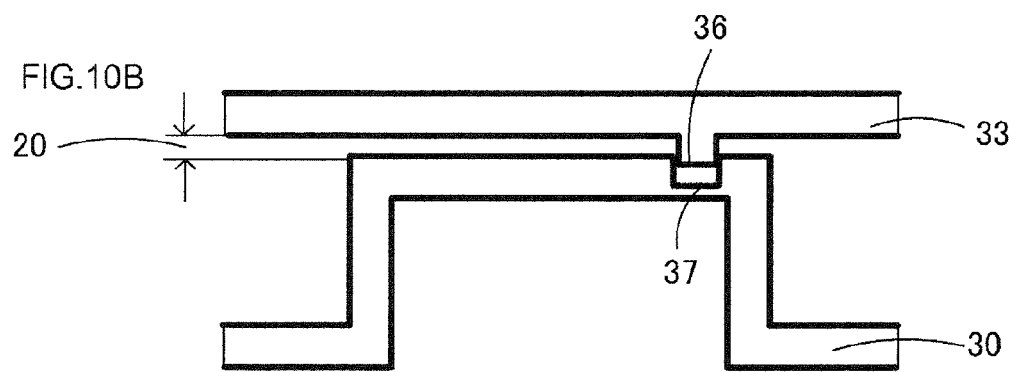
Figure 10C:
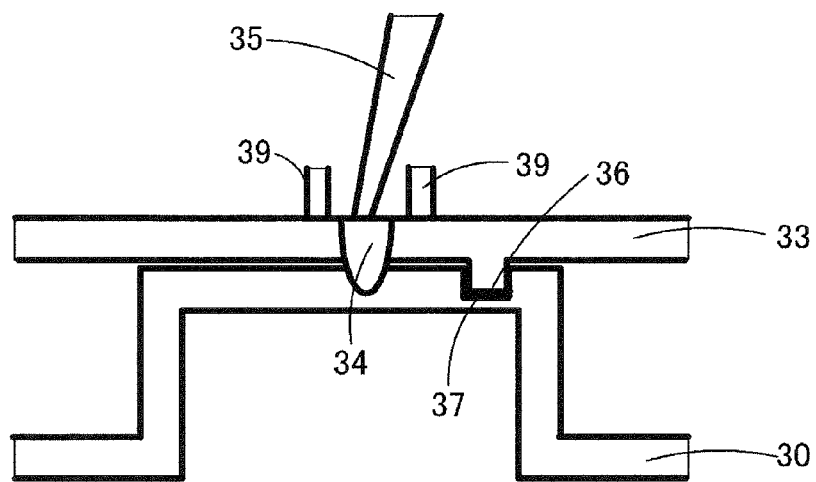

FIGS. 10A, 10B, and 10C are enlarged views of the place where the upper emitter terminal 33, a second member, and the lower emitter terminal 30, a first member, are put overlapping with each other, in which FIG. 10A is a sectional view of the upper emitter terminal 33 having a protruding part 36 and the lower emitter terminal 30 having a recessed part 37, FIG. 10B is a sectional view showing the protruding part 36 of the upper emitter terminal 33 is engaged with the recessed part 37 of the lower emitter terminal 30, and FIG. 10C is a sectional view showing the laser welding process while the upper emitter terminal 33 is pressed by the pair of claws 39. The protruding part 36 formed on the upper emitter terminal 33 and the recessed part 37 formed on the lower emitter terminal 30 allows positioning of the upper emitter terminal 33, avoiding positional shift of the emitter terminals in the assembling process.

In order to reduce the gap 10 between the emitter terminals 30 and 33, the surface of the upper emitter terminal 33 is pressed with the pair of claws 39 of the laser welding jig 100, and laser light irradiates the upper emitter terminal in the configuration with the gap 10 between the upper emitter terminal 33 and the lower emitter terminal 30 disposed under the upper emitter terminal 33 being at most 300 µm. Thus, a good welded part 34 is obtained.

Figure 11:
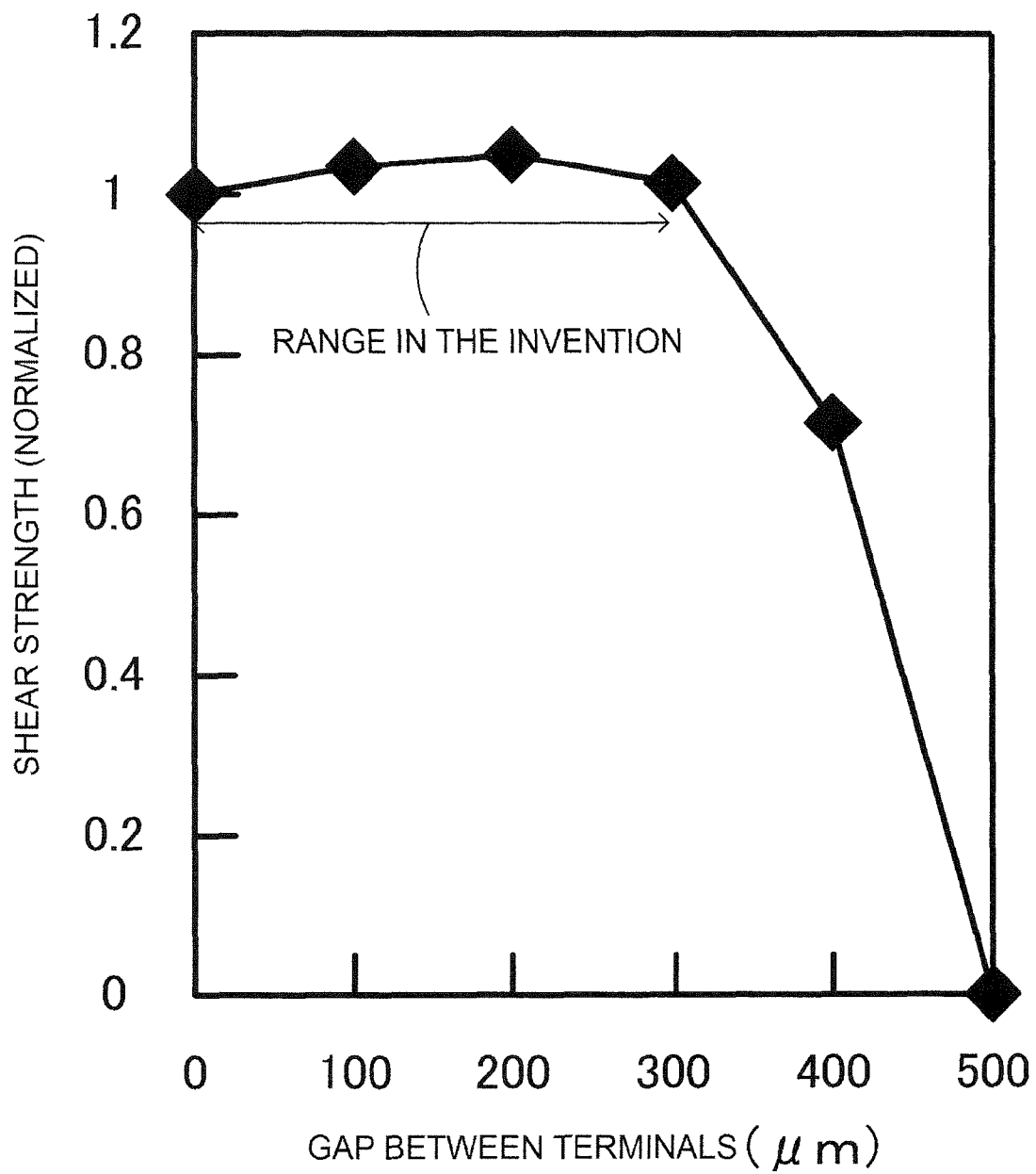
FIG. 11 shows a relationship between a gap between terminals and shear strength of the joined part.

FIG. 11 shows a relationship between the gap 10 between the emitter terminals 30 and 33 and shear strength of the welded part 34. An upper emitter terminal 33 and a lower emitter terminal 30 are disposed overlapping with each other intercalating a spacer between the terminals. Laser welding is conducted in this configuration in which the gap 10 between the emitter terminals 30 and 33 is controlled by the spacer. FIG. 11 shows shear strength in terms of normalized value with reference to the value in the condition of direct close contact, which means without a gap. The shear strength here is a tensile strength when the terminals 30 and 33 are pulled in the longitudinal direction, and represents a joint strength of the welded part 34.

FIG. 11 shows that the shear strength is larger than the one in the case of no gap when the gap 10 between the terminals 30 and 33 is in the range of up to 300 µm. At the gap of 400 µm, the shear strength decreased by about 30% as compared with the case of no gap, and at the gap of 500 µm, laser welding becomes impossible. In order to obtain a shear strength larger than the value in the case of direct contact, which means no gap, the gap between the terminals 30 and 33 needs to be at most 300 µm. It has been demonstrated that a shear strength larger than the one in the case of direct contact can be readily obtained by laser welding using the laser welding jig 100 of the invention as shown in FIGS. 5A, 5B, and 5C.

A gap larger than 300 µm causes adverse effect of increased heat resistance at the welded part 34 as well as decrease in the shear strength. Therefore, the gap between the terminals 30 and 33 is necessarily at most 300 µm.

Figure 12A:
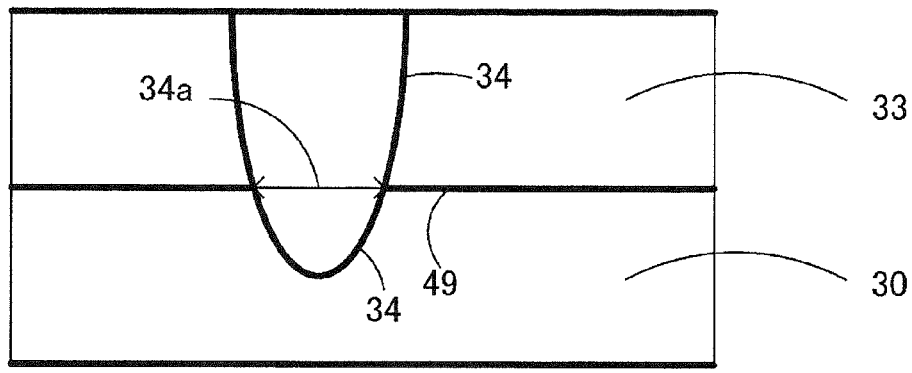
FIGS. 12A, 12B, and 12C show a relationship between the gap between the terminals and the configuration of the welded part.
Figure 12B:
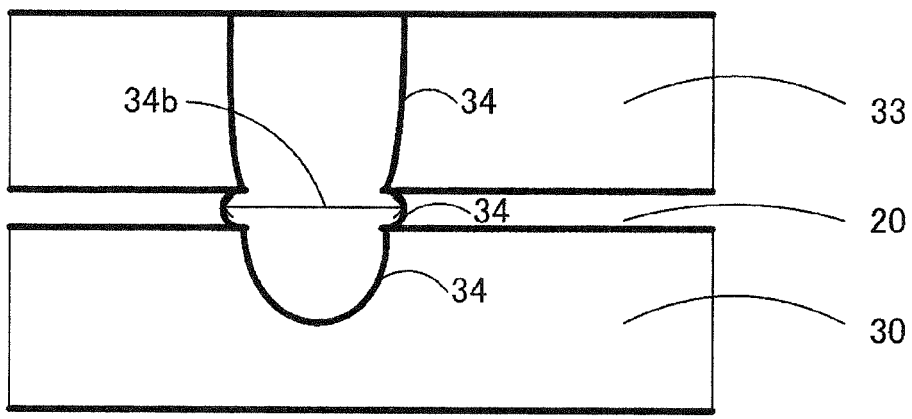
Figure 12C:
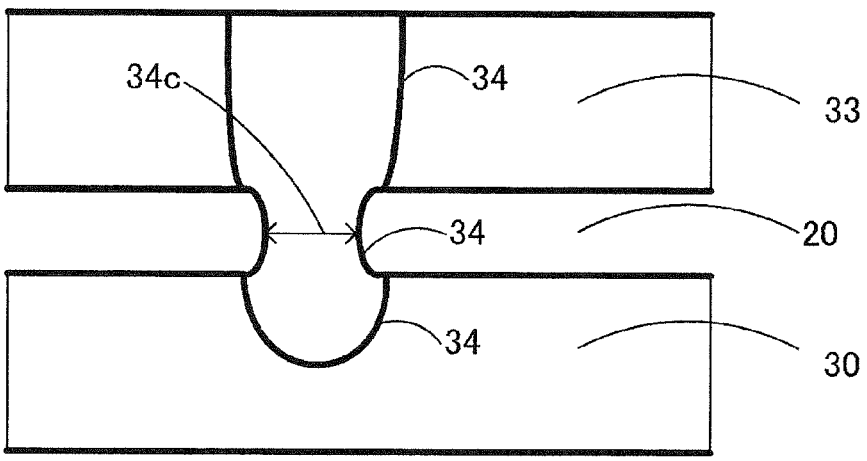

FIGS. 12A, 12B, and 12C show relationship between the gap 10 between the terminals 30 and 33 and the configuration of the welded part 34, in which FIG. 12A is a sectional view without gap 10 between the terminals 30 and 33, FIG. 12B is a sectional view with the gap 10 between the terminals 30 and 33 not larger than 300 µm, and FIG. 12C is a sectional view with the gap 10 between the terminals 30 and 33 larger than 300 µm.

Referring to FIG. 12A, in the case of no gap, which is a direct contact case, the welded part 34a cannot expand at the boundary 49 between the terminals 30 and 33.

Referring to FIG. 12B, in the case the gap between the terminals 30 and 33 is not larger than 300 µm, the welded part expands at the gap, increasing the area of the welded part 34b. As a consequence, the shear strength becomes larger than the case of no gap.

Referring to FIG. 12C, when the gap 10 between the terminals 30 and 33 exceeds 300 µm, the welded part 34c at the gap 10 shrinks in the center portion of the welded part, and thus, the shear strength is lowered.

Figure 13:
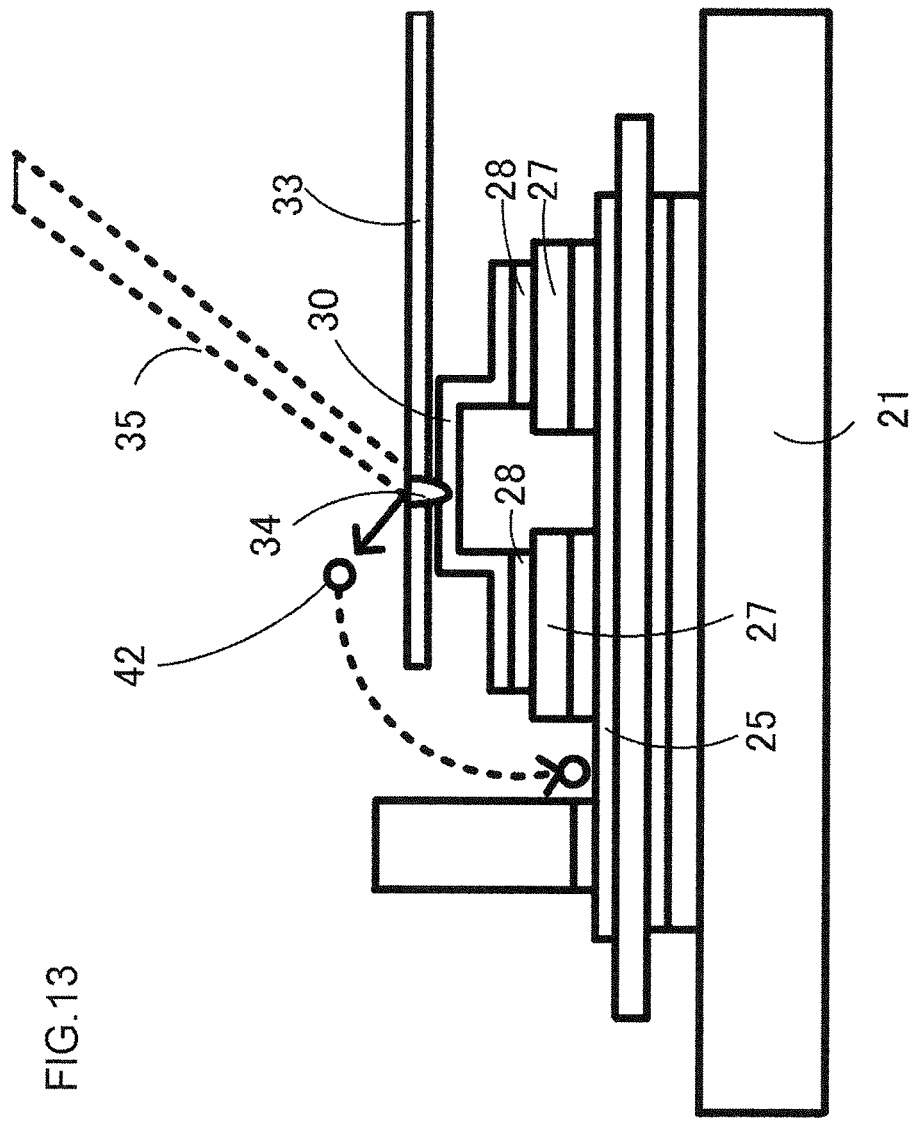
FIG. 13 shows a sputtered particle generated in the case without resin sealing.

FIG. 13 shows scattering of sputtered metallic particles 42 in the laser welding process without resin sealing. The sputtered particles 42 attach onto the semiconductor chip 27 and the front surface conductor pattern 25, which may cause failure of electric insulation. This failure can be avoided by sealing the semiconductor chip 27 with a resin up to the level of joining material 28.

Stable joining strength is ensured by pressing the upper emitter terminal 33 using the laser welding jig 100 of the invention to make the gap between the upper emitter terminal 33 and the lower emitter terminal 30 be at most 300 μm, and joining the lower emitter terminal 30 and the upper emitter terminal 33 according to the laser welding method of the invention.

The lower emitter terminal 30 and the upper emitter terminal 33 are made of a high thermal conductivity material exhibiting a thermal conductivity of at least 100 W/(m·K). Preferable materials include: copper (Cu), a copper-molybdenum (Cu—Mo) alloy, a copper-tungsten (Cu—W) alloy, molybdenum (Mo), tungsten (W), an aluminum-silicon carbide (Al—SiC) alloy, and a silicon-silicon carbide (Si—SiC) alloy, for example.

The thickness of the lower emitter terminal 30 is preferably at least 0.5 mm, and the thickness of the upper emitter terminal 33 is at most 1 mm. If the thickness of the lower emitter terminal 30 less than 0.5 mm causes the laser welded part penetrates through the lower emitter terminal 30. The thickness of the lower emitter terminal 30 is more preferably, not smaller than 0.8 mm.

The thickness of the upper emitter terminal 33 thicker than 1 mm increases the proportion of the energy of laser welding consumed in the upper emitter terminal 33 and decreases the proportion of the energy consumed in the lower emitter terminal 30. As a consequence, the area of melted part of the lower emitter terminal decreases resulting in lowered shear strength.

Both of the lower emitter terminal 30 and the upper emitter terminal 33, or only the upper emitter terminal 33, which is irradiated by laser light is preferably plated with a material that absorbs much energy of laser light. Preferable plating includes electroless nickel-phosphorus (Ni—P) plating, electroless nickel-boron (Ni—B) plating, and electrolytic nickel (Ni) plating, for example. The plating is favorable because it improves absorption coefficient of laser light.

Fourth Embodiment

Figure 14:
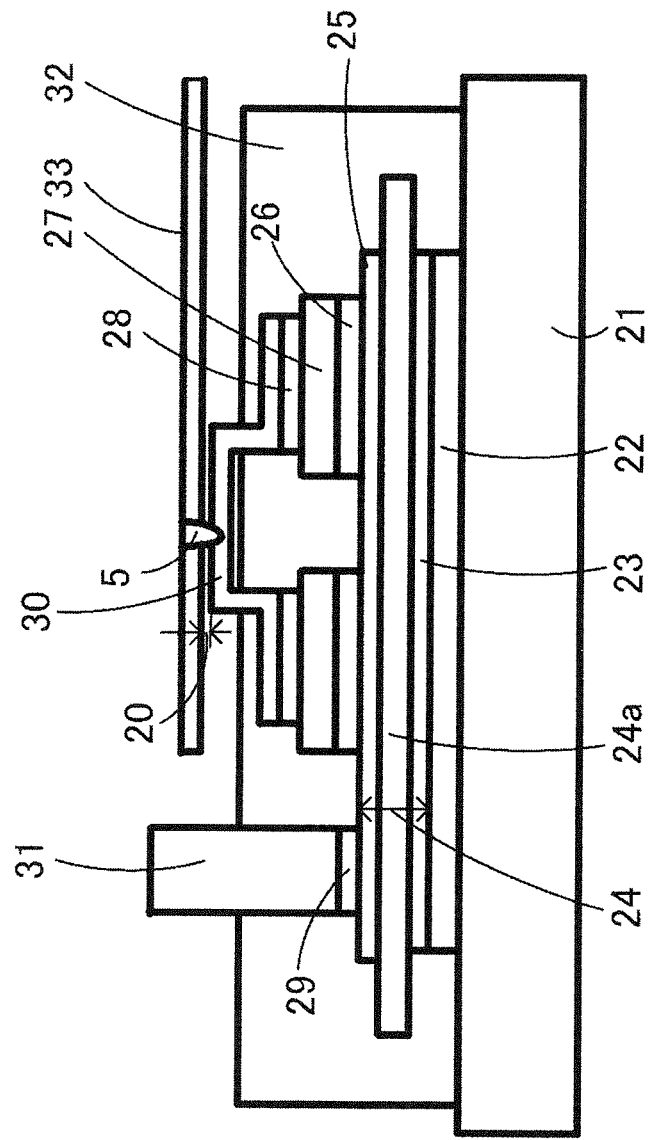
FIG. 14 is a sectional view of an essential part of a semiconductor device of the fourth embodiment of the present invention.
Figure 15:
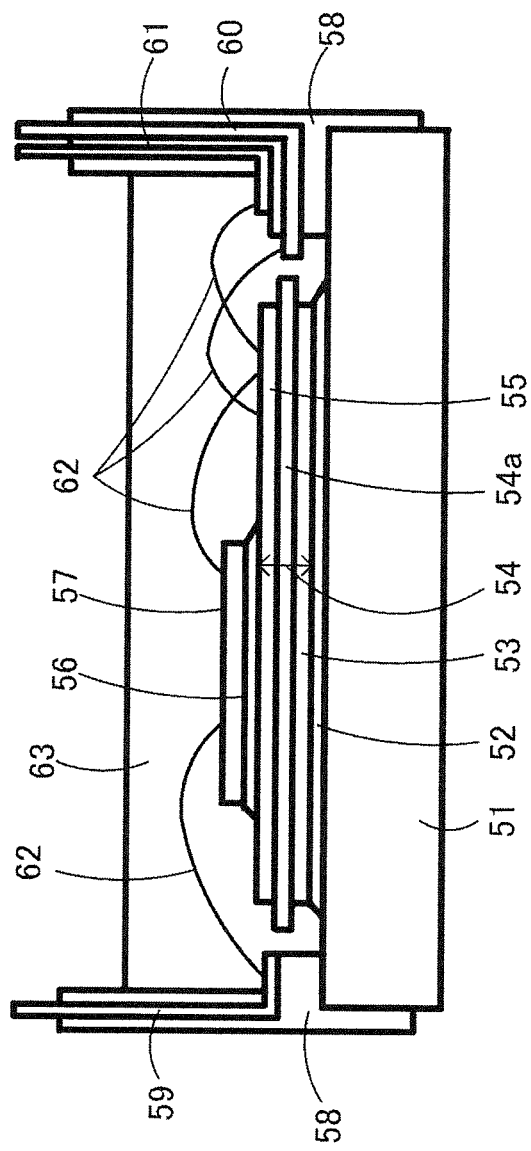
FIG. 15 shows a construction of a power semiconductor module of a general type.

FIG. 14 is a sectional view of an essential part of a semiconductor device 200 according to the fourth embodiment of the present invention. The semiconductor device 200 is manufactured according to the laser welding method of the first embodiment and using the laser welding jig 100 of the second embodiment.

The semiconductor device 200 comprises a heat radiating base 21, a DCB substrate 24 having a rear surface conductor pattern 23 that is fixed through a joining material 22 such as solder to the heat radiating base 21, and a semiconductor chip fixed to a front surface conductor pattern 25 through a joining material 26 such as solder. The DCB substrate 24 is composed of a ceramic insulated substrate 24a, a rear surface conductor pattern 23 fixed on the rear surface of the ceramic insulated substrate 24a, and a front surface conductor pattern fixed on the front surface of the ceramic insulated substrate 24a. The semiconductor device 200 further comprises a lower emitter terminal 30 fixed to the surface electrode of the semiconductor chip 27 through a joining material 28 such as solder, an upper emitter terminal 33 fixed to the lower emitter terminal by means of laser welding, and a collector terminal 31 fixed to the front surface conductor pattern 25 through a joining material 29 such as solder. The semiconductor device 200 also comprises a resin sealing material 32 that seals the whole device excepting the side face and rear face of the heat radiating base 21, the front surface of the lower emitter terminal 30, a tip portion of the collector terminal 31, and the upper emitter terminal 33, which are exposed to the air.

A high shear strength is obtained by ensuring the gap between lower emitter terminal 30 and the upper emitter terminal 33 to be within 300 μm. Positional shift of the upper emitter terminal 33 in assembling process of the semiconductor device 200 is avoided by forming a recessed part 37 on the lower emitter terminal 30 and a protruding part 36 on the upper emitter terminal 33 and positioning a welding place of the terminals 30 and 33 with the aid of the protruding part and the recessed part. Alternatively, positional shift of the upper emitter terminal 33 in assembling process of the semiconductor device 200 is likewise avoided by forming a protruding part on the lower emitter terminal 30 and a recessed part on the upper emitter terminal 33 and positioning a welding place of the terminals 30 and 33 with the aid of the protruding part and the recessed part. The recessed part can be a through hole.

In some cases in the semiconductor device 200, two linear compression marks with a length of about 1 mm may be formed on the upper emitter terminal 33 at two places on either side of the welded part 34.

DESCRIPTION OF SYMBOLS

1: first welded member, first member
2: second welded member, second member
4: force
5, 34: welded part
6: irradiated surface
10: gap
21, 51: heat radiating base
22, 26, 28, 29, 52, 56: joining material
23, 53: rear surface conductor pattern
24, 54: DCB substrate
24a, 54a: ceramic insulated substrate
25, 55: front surface conductor pattern
27, 57: semiconductor chip
30: lower emitter terminal, first member
30a: rear surface
31: collector terminal
32: resin sealing material
32a: front surface
33: upper emitter terminal, second member
35: laser light
36 protruding part
37: recessed part
39: claw, pressing part
40: support column
42: sputtered particle
49: boundary region
58: terminal-inserted type resin casing
59, 60, 61: terminal
62: bonding wire
63: gel sealing material
100: laser welding jig
200: semiconductor device
500: power semiconductor module
D1, D2: diameter
L: length
T: interval

What is claimed is:

1. A semiconductor device comprising:
   a ceramic insulated substrate;
   a front surface conductor pattern fixed on a front surface of the ceramic insulated substrate;
   a semiconductor chip electrically connected to the front surface conductor pattern;
   a first member electrically connected to the semiconductor chip; and
   a second member laser-welded to the first member at at least one portion to electrically connect thereto;
   wherein a gap between the first member and the second member at the portion of laser-welding is at most 300 µm.

2. The semiconductor device according to claim 1, wherein the first and second members are further welded at another portion, and
   a distance between an outer periphery of the one portion of laser welding and an outer periphery of the another portion of laser welding is at most 2 mm.

3. The semiconductor device according to claim 1, wherein the first member has a thickness of at least 0.5 mm and the second member has a thickness of at most 1 mm.

4. The semiconductor device according to claim 1, wherein the first member and the second member are planar at least at the one portion of the laser welding.

5. The semiconductor device according to claim 1, wherein each of the first and second member has an engaging part for positioning the first member and the second member, and
   the portion of the laser welding is different from the engaging part.

6. The semiconductor device according to claim 1, further comprising a sealing material for sealing the ceramic insulated substrate, the front surface conductor pattern, the semiconductor chip, and a part of the first member,
   wherein the one portion of the laser welding is not sealed with the sealing material.

* * * * *